United States Patent
Sugiura et al.

(10) Patent No.: US 10,148,238 B2
(45) Date of Patent: Dec. 4, 2018

(54) AMPLIFIER CIRCUIT AND MULTIPATH NESTED MILLER AMPLIFIER CIRCUIT

(71) Applicant: SII Semiconductor Corporation, Chiba-shi, Chiba (JP)

(72) Inventors: Masakazu Sugiura, Chiba (JP); Toshiyuki Tsuzaki, Chiba (JP); Yuji Shiine, Chiba (JP); Manabu Fujimura, Chiba (JP)

(73) Assignee: ABLIC INC., Chiba (JP)

( * ) Notice: Subject to any disclaimer, the term of this patent is extended or adjusted under 35 U.S.C. 154(b) by 4 days.

(21) Appl. No.: 15/608,182

(22) Filed: May 30, 2017

(65) Prior Publication Data

US 2017/0353166 A1  Dec. 7, 2017

(30) Foreign Application Priority Data

Jun. 2, 2016 (JP) ................. 2016-111232

(51) Int. Cl.
| | |
|---|---|
| *H03F 1/02* | (2006.01) |
| *H03F 3/45* | (2006.01) |
| *H03F 1/08* | (2006.01) |
| *H03F 3/00* | (2006.01) |

(52) U.S. Cl.
CPC ......... *H03F 3/45977* (2013.01); *H03F 1/083* (2013.01); *H03F 3/005* (2013.01); *H03F 3/45* (2013.01); *H03F 3/45475* (2013.01)

(58) Field of Classification Search
CPC ............ H03F 1/02; H03F 1/303; H03F 3/005; H03F 3/2178; H03F 2200/231; H03F 2200/249; H03F 2200/375; H03F 2200/396; H03F 2200/414; H03F 2203/7212; H03F 2203/7233; H03F 3/45475
USPC .............................. 330/9, 51; 327/124, 307
See application file for complete search history.

(56) References Cited

U.S. PATENT DOCUMENTS

| | | | | |
|---|---|---|---|---|
| 7,535,295 B1* | 5/2009 | Huijsing | ................... | H03F 1/26 327/124 |
| 7,696,817 B1* | 4/2010 | Boucher | ............. | H03F 3/45475 330/51 |
| 8,084,969 B2* | 12/2011 | David | ................... | G01D 5/145 310/12.01 |
| 9,172,332 B2* | 10/2015 | Tomioka | ................. | H03F 3/387 |
| 9,246,446 B2 | 1/2016 | Nagahisa | | |
| 9,608,580 B2* | 3/2017 | Ko | ........................... | H03F 3/72 |

\* cited by examiner

*Primary Examiner* — Khanh V Nguyen
(74) *Attorney, Agent, or Firm* — Brinks Gilson & Lione

(57) ABSTRACT

Provided are an amplifier circuit capable of reducing DC offset voltage without an increase in chip area and degradation in frequency characteristics, and a multipath nested miller amplifier circuit. The amplifier circuit includes a chopper switching circuit, a sampling circuit configured to sample an output signal from the chopper switching circuit, and a holding circuit configured to hold a signal output from the sampling circuit.

4 Claims, 3 Drawing Sheets

AMPLIFIER CIRCUIT AND MULTIPATH NESTED MILLER AMPLIFIER CIRCUIT

RELATED APPLICATIONS

This application claims priority under 35 U.S.C. § 119 to Japanese Patent Application No. 2016-111232 filed on Jun. 2, 2016, the entire content of which is hereby incorporated by reference.

BACKGROUND OF THE INVENTION

1. Field of the Invention

The present invention relates to an amplifier circuit configured to reduce DC offset voltage, in particular, to an amplifier circuit in which high-frequency noise accompanying clock-based operation is reduced, and also to a multipath nested miller amplifier circuit.

2. Description of the Related Art

As amplifier circuits configured to amplify small signals such as output signals from a sensor, there have hitherto been known amplifier circuits having reduced DC offset voltage (note, for example, Japanese Patent Application Laid-open No. 2014-216705).

FIG. 6 is a block diagram for illustrating a related-art amplifier circuit.

A related-art amplifier circuit 801 includes input terminals IN1 and IN2, output terminals OUT1 and OUT2, chopper switching circuits 831 and 841, a voltage-to-current conversion circuit 832, an in-phase feedback circuit 833, and an LPF circuit 851.

A potential at the input terminal IN1 is denoted by VIN1, a potential at the input terminal IN2 is denoted by VIN2, a potential at the output terminal OUT1 is denoted by VOUT1, and a potential at the output terminal OUT2 is denoted by VOUT2. In this case, the voltage of an input signal Vsi is VIN1−VIN2, and an output voltage Vo is VOUT1−VOUT2.

The chopper switching circuit 831 modulates, based on a clock, the input signals Vsi input to input terminals INA and INB, and provides the resultant from output terminals OUTA and OUTB. The voltage-to-current conversion circuit 832 amplifies the modulated signals Vsi applied to input terminals INP and INN, and provides the resultant from output terminals OUTP and OUTN. The in-phase feedback circuit 833 receives, at input terminals NA and NB, the output signals from the voltage-to-current conversion circuit 832, and provides, from a terminal CONT to the voltage-to-current conversion circuit 832, signals for determining the DC operating points of the output terminals OUTP and OUTN of the voltage-to-current conversion circuit 832. The chopper switching circuit 841 demodulates, based on a clock, the amplified signals Vsi to input terminals INA and INB from the voltage-to-current conversion circuit 832, and provides the resultant from output terminals OUTA and OUTB. The LPF circuit 851 removes high-frequency noise from the demodulated signals Vsi sent from the chopper switching circuit 841 to input terminals IN1 and IN2, and provides the resultant from output terminals OUT1 and OUT2.

The DC offset voltage of the voltage-to-current conversion circuit 832 is herein represented by Vni. The offset voltage Vni is amplified by the voltage-to-current conversion circuit 832, and is modulated by the chopper switching circuit 841. That is, the LPF circuit 851 receives the signal Vsi and the offset voltage Vni modulated to high-frequency noise. Since the LPF circuit 851 attenuates a high-frequency component, the offset voltage Vni, which was modulated to a high-frequency noise, is removed from the output voltage Vo.

Consequently, the related-art amplifier circuit 801 can supply the output voltage Vo that is less affected by the offset voltage Vni.

SUMMARY OF THE INVENTION

The present invention provides an amplifier circuit capable of reducing DC offset voltage without an increase in chip area and degradation in frequency characteristics, and also provides a multipath nested miller amplifier circuit.

An amplifier circuit includes: a chopper switching circuit configured to provide a modulated signal of an input signal in one of a positive phase and a negative phase; a voltage-to-current conversion circuit connected to the chopper switching circuit, and configured to generate an output current according to an output voltage from the chopper switching circuit; a sampling circuit connected to the voltage-to-current conversion circuit, and configured to: sample electric charges according to the output current from the voltage-to-current conversion circuit; and provide a voltage according to an electric charge obtained by one of the addition and the subtraction of the sampled electric charges; and a holding circuit connected to the sampling circuit, and configured to hold the voltage output from the sampling circuit.

Further, a multipath nested miller amplifier circuit includes: the above-mentioned amplifier circuit connected to an input terminal of the multipath nested miller amplifier circuit; a first amplifier connected to an output terminal of the amplifier circuit; a second amplifier connected to the input terminal; and a third amplifier connected to an output terminal of the first amplifier and an output terminal of the second amplifier.

According to the amplifier circuit of the present invention, by the absence of an LPF circuit having large resistor and capacitor it is possible to provide the amplifier circuit capable of reducing the DC offset voltage without the increase in chip area and the degradation in frequency characteristics, and is also possible to provide the multipath nested miller amplifier circuit.

DETAILED DESCRIPTION OF THE PREFERRED EMBODIMENTS

Figure 1:
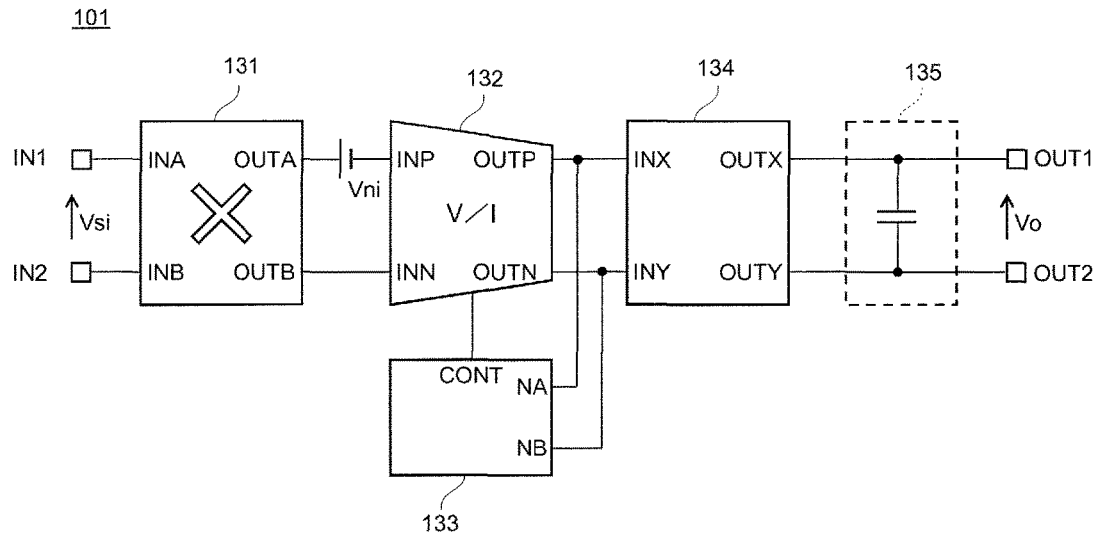
FIG. 1 is a block diagram for illustrating an amplifier circuit according to an embodiment of the present invention.

FIG. 1 is a block diagram for illustrating an amplifier circuit according to an embodiment of the present invention.

An amplifier circuit 101 according to an embodiment of the present invention includes input terminals IN1 and IN2, output terminals OUT1 and OUT2, a chopper switching circuit 131, a voltage-to-current conversion circuit 132, an in-phase feedback circuit 133, a sampling circuit 134, and a holding circuit 135. An offset voltage at an input terminal of the voltage-to-current conversion circuit 132 is represented by Vni.

The chopper switching circuit 131 has input terminals INA and INB connected to the input terminals IN1 and IN2 of the amplifier circuit 101, respectively, and output terminals OUTA and OUTB connected to input terminals INP and INN of the voltage-to-current conversion circuit 132, respectively. The voltage-to-current conversion circuit 132 has an output terminal OUTP connected to an input terminal NA of the in-phase feedback circuit 133 and an input terminal INX of the sampling circuit 134, and an output terminal OUTN connected to an input terminal NB of the in-phase feedback circuit 133 and an input terminal INY of the sampling circuit 134. The in-phase feedback circuit 133 has an output terminal CONT connected to an internal terminal of the voltage-to-current conversion circuit 132. The sampling circuit 134 has an output terminal OUTX connected to a first terminal of the holding circuit 135 and the output terminal OUT1 of the amplifier circuit 101, and an output terminal OUTY connected to a second terminal of the holding circuit 135 and the output terminal OUT2.

The chopper switching circuit 131 takes one of a positive phase state, in which the input terminal INA is electrically connected to the output terminal OUTA, and the input terminal INB is electrically connected to the output terminal OUTB, respectively, and a negative phase state, in which the input terminal INA is electrically connected to the output terminal OUTB, and the input terminal INB is electrically connected to the output terminal OUTA, respectively, based on a clock.

The voltage-to-current conversion circuit 132 provides current which was converted from voltage. Assume a potential at the input terminal INP is VINP, a potential at the input terminal INN is VINN, a potential at the output terminal OUTP is VOUTP, and a potential at the output terminal OUTN is VOUTN, respectively. When a difference between the input voltages (VINP−VINN) is positive, the voltage-to-current conversion circuit 132 sources a current to the output terminal OUTP and sinks the current from the output terminal OUTN. As the difference becomes larger, the current becomes larger. When the difference between the input voltages (VINP−VINN) is negative, the voltage-to-current conversion circuit 132 sinks a current from the output terminal OUTP and sources the current to the output terminal OUTN. As the difference becomes larger, the current becomes larger. The voltage-to-current conversion circuit 132 can be regarded as an amplifier circuit because the output voltages VOUTP and VOUTN appear according to impedances related to the output terminals OUTP and OUTN.

The in-phase feedback circuit 133 receives, at the input terminals NA and NB, the output signals from the voltage-to-current conversion circuit 132, and provides, from the terminal CONT to the voltage-to-current conversion circuit 132, signals for determining the DC operating points of the output terminals OUTP and OUTN of the voltage-to-current conversion circuit 132.

A potential at the input terminal INX is denoted by VINX, a potential at the input terminal INY is denoted by VINY, a potential at the output terminal OUTX is denoted by VOUTX, and a potential at the output terminal OUTY is denoted by VOUTY. The sampling circuit 134 samples electric charges based on the current externally sunk from or sourced to the input terminals INX and INY, and the sampled electric charges are added or subtracted, in synchronization with this operation, the sampling circuit 134 provides, from the output terminals OUTX and OUTY, a voltage (VOUTX−VOUTY) based on the added or subtracted electric charges.

The holding circuit 135 has a function of holding electric charges. There appears a voltage based on electric charges held between the first terminal and the second terminal of the holding circuit 135, and the capacitance value of the holding circuit 135.

The operation of the amplifier circuit 101 of this embodiment is described. A potential at the input terminal IN1 is denoted by VIN1, a potential at the input terminal IN2 is denoted by VIN2, a potential at the output terminal OUT1 is denoted by VOUT1, and a potential at the output terminal OUT2 is denoted by VOUT2. In this case, the voltage of the input signal Vsi is VIN1−VIN2, and the output voltage Vo is VOUT1−VOUT2.

The chopper switching circuit 131 receives, at the input terminals NA and INB, the input signals Vsi applied to the amplifier circuit 101, modulates the input signals Vsi according to a clock, and provides the resultant as the modulated signals Vsi from the output terminals OUTA and OUTB. The voltage-to-current conversion circuit 132 amplifies the modulated signals Vsi input to the input terminals INP and INN, and provides the resultant from the output terminals OUTP and OUTN. The in-phase feedback circuit 133 receives, at the input terminals NA and NB, the output signals from the voltage-to-current conversion circuit 132, and provides, from the terminal CONT to the voltage-to-current conversion circuit 132, the signals for determining the DC operating points of the output terminals OUTP and OUTN of the voltage-to-current conversion circuit 132.

The voltage-to-current conversion circuit 132 sinks or sources a current according to the amplified and modulated signal Vsi to the sampling circuit 134. Further, the voltage-to-current conversion circuit 132 also sinks or sources a current according to the amplified offset voltage Vni to the sampling circuit 134. The sampling circuit 134 performs sampling operation of the above-mentioned currents based on a clock. A high-level period and a low-level period of the clock are herein assumed to be the same in order to simplify the description.

Here, the quantity of electric charges sampled by the sampling circuit 134 depending on the current which is in accordance with the input signal Vsi is denoted by Qso, and the quantity of electric charges sampled by the sampling circuit 134 depending on the current which is in accordance with the offset voltage Vni is denoted by Qno.

Input currents to the sampling circuit 134 are the current according to the input signal Vsi through the chopper switching circuit 131, and the current according to the offset voltage Vni without passing through the chopper switching circuit 131. Thus, the sampling circuit 134 alternately samples an electric charge (+Qso−Qno) and an electric charge (−Qso−Qno) based on a clock.

In the sampling circuit 134, for example, subtraction is made between the sampled electric charges (+Qso−Qno) and (−Qso−Qno) to obtain an electric charge (2×Qso), permitting removal of the electric charge Qno that is based on the offset voltage Vni. Then, the electric charges (2×Qso) are provided from the output terminals OUTX and OUTY according to a clock.

The holding circuit 135 holds the electric charges (2×Qso) supplied from the sampling circuit 134, and provides the electric charges (2×Qso) to the output terminals OUT1 and OUT2 of the amplifier circuit 101.

Figure 2:
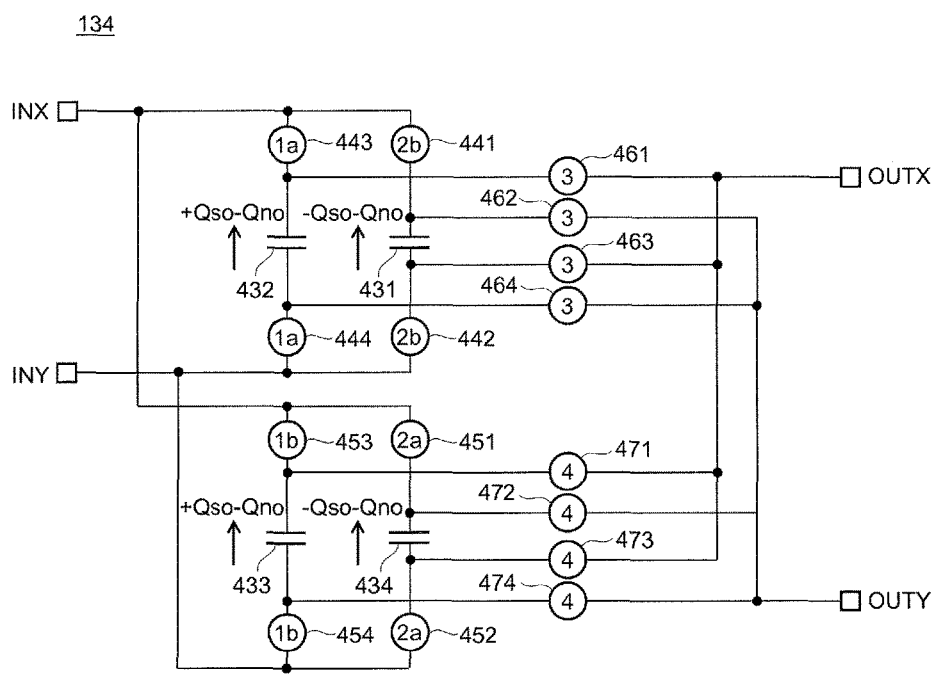
FIG. 2 is a block diagram for illustrating an example of a sampling circuit in the amplifier circuit of the embodiment.

FIG. 2 is a block diagram for illustrating an example of the sampling circuit 134.

The sampling circuit 134 includes the input terminals INX and INY, the output terminals OUTX and OUTY, switches 441 to 444, 451 to 454, 461 to 464, and 471 to 474, and capacitors 431 to 434. Each pair of the capacitors 431 and 432 and the capacitors 433 and 434 is a capacitor pair for sampling. The respective switches are turned on and off based on clocks corresponding to the numbers given to the switches.

Figure 3:
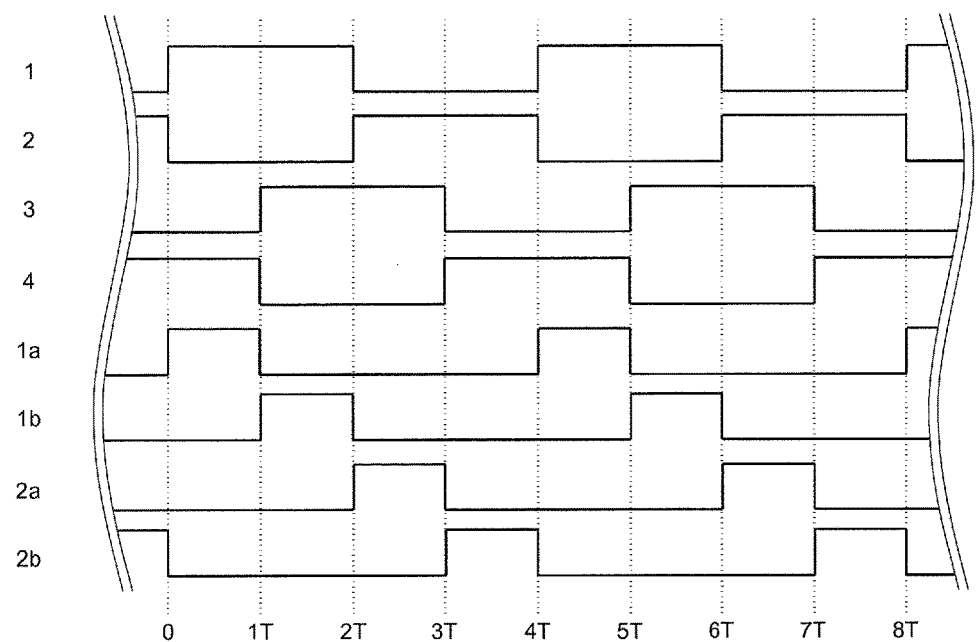
FIG. 3 is a timing chart for illustrating an example of clocks in the amplifier circuit of the embodiment.

FIG. 3 is a timing chart for illustrating an example of clocks in the amplifier circuit 101 of this embodiment. Each switch is turned on when the corresponding clock is at High level, and is turned off when the corresponding clock is at Low level, for example.

The chopper switching circuit 131 chops the input signal Vsi based on Clocks 1 and 2, and provides the resultant to the voltage-to-current conversion circuit 132. The chopper switching circuit 131 is herein regarded as in a positive phase state when Clock 1 is at High level and Clock 2 is at Low level and in a negative phase state when Clock 1 is at Low level and Clock 2 is at High level.

The sampling circuit 134 of FIG. 2 samples output from the voltage-to-current conversion circuit 132 based on Clocks 1a, 1b, 2a, and 2b in the following manner.

In Period [0-1T], Clock 1a is at High level, and hence the switch 443 and the switch 444 are turned on so that the electric charge (+Qso−Qno) is sampled to the capacitor 432.

In Period [1T-2T], Clock 1b is at High level, and hence the switch 453 and the switch 454 are turned on so that the electric charge (+Qso−Qno) is sampled to the capacitor 433.

In Period [2T-3T], Clock 2a is at High level, and hence the switch 451 and the switch 452 are turned on so that the electric charge (−Qso−Qno) is sampled to the capacitor 434.

In Period [3T-4T], Clock 2b is at High level, and hence the switch 441 and the switch 442 are turned on so that the electric charge (−Qso−Qno) is sampled to the capacitor 431.

Further, the sampling circuit 134 of FIG. 2 subjects the electric charge sampled based on Clocks 3 and 4 to the subtraction, and outputs the resultant to the holding circuit 135 in the following manner.

In Period [1T-3T], Clock 3 is at High level, and hence the switches 461 to 464 are turned on. The electric charge (+Qso−Qno) of the capacitor 432 and the electric charge (−Qso−Qno) of the capacitor 431 are subjected to the subtraction, and as a result, the electric charges (2×Qso) are provided to the output terminals OUTX and OUTY.

In Period [3T-5T], Clock 4 is at High level, and hence the switches 471 to 474 are turned on. The electric charge (+Qso−Qno) of the capacitor 433 and the electric charge (−Qso−Qno) of the capacitor 434 are subjected to the subtraction, and as a result, the electric charges (2×Qso) are provided to the output terminals OUTX and OUTY.

At this time, it is more desired that the two capacitors (e.g., capacitor 432 and capacitor 431) forming the capacitor pair have the same capacitance value. This is because, in this case, the impedance of the switches when the switches are turned on and time constants that vary depending on the capacitance values can be the same between the two capacitors forming the capacitor pair.

In addition, when clamping elements such as PN junction elements are provided between the respective terminals of the switches 461 to 464 and 471 to 474, the DC operating point of the holding circuit 135 can be stabilized at a value close to the DC operating points which are determined by the in-phase feedback circuit 133 of the output terminals OUTP and OUTN of the voltage-to-current conversion circuit 132. When the holding circuit 135 has a stable DC operating point, an input operating point for a latter circuit (not shown), for example, an amplifier circuit can be stabilized. There is thus provided an effect of enabling the amplifier circuit to more stably operate, for example.

Figure 4:
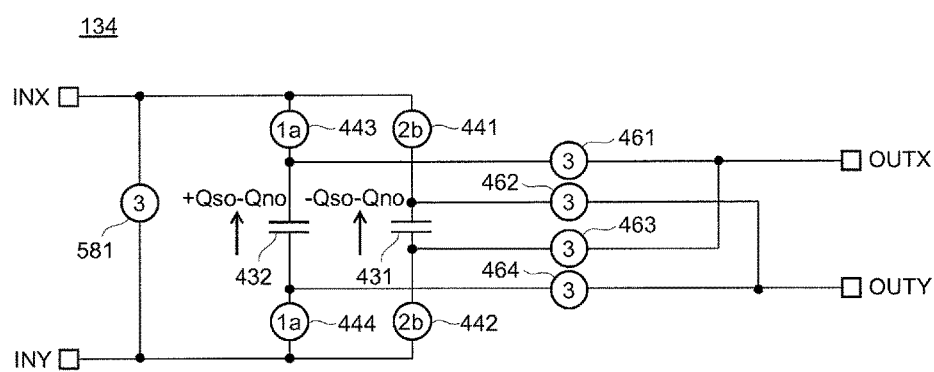
FIG. 4 is a block diagram for illustrating another example of the sampling circuit in the amplifier circuit of the embodiment.

FIG. 4 is a block diagram for illustrating another example of the sampling circuit 134.

The number of the capacitor pairs for sampling in the sampling circuit 134 of FIG. 2 is reduced to one, and a switch 581 that is controlled based on Clock 3 is provided between the input terminals INX and INY.

The sampling circuit 134 of FIG. 4 can basically satisfy functions similar to those of the sampling circuit 134 of FIG. 2.

The switch 581 is turned on when none of the capacitors 431 and 432 is in the sampling operation so that the operating points of the output terminals OUTP and OUTN of the voltage-to-current conversion circuit 132 can be more stabilized. Thus, it is more desirable to have the switch 581, but the absence of the switch 581 will also be allowed.

As described above, since the amplifier circuit 101 of this embodiment includes the sampling circuit 134 configured to sample output signals from the chopper switching circuit 131, and the holding circuit 135 configured to hold signals output from the sampling circuit 134, the influence of the offset voltage Vni can be removed without an LPF circuit. The present invention achieves an amplifier circuit capable of reducing DC offset voltage without an increase in chip area and degradation in frequency characteristics.

In the above description, the amplifier circuit 101 includes the chopper switching circuit 131, the voltage-to-current conversion circuit 132, the in-phase feedback circuit 133, the sampling circuit 134, and the holding circuit 135. However, the present invention is by no means limited to this embodiment as long as satisfying conditions that the functions of the amplifier circuit are exerted.

For example, the in-phase feedback circuit 133 may not be included if the in-phase feedback circuit 133 is not particularly required.

Figure 5:
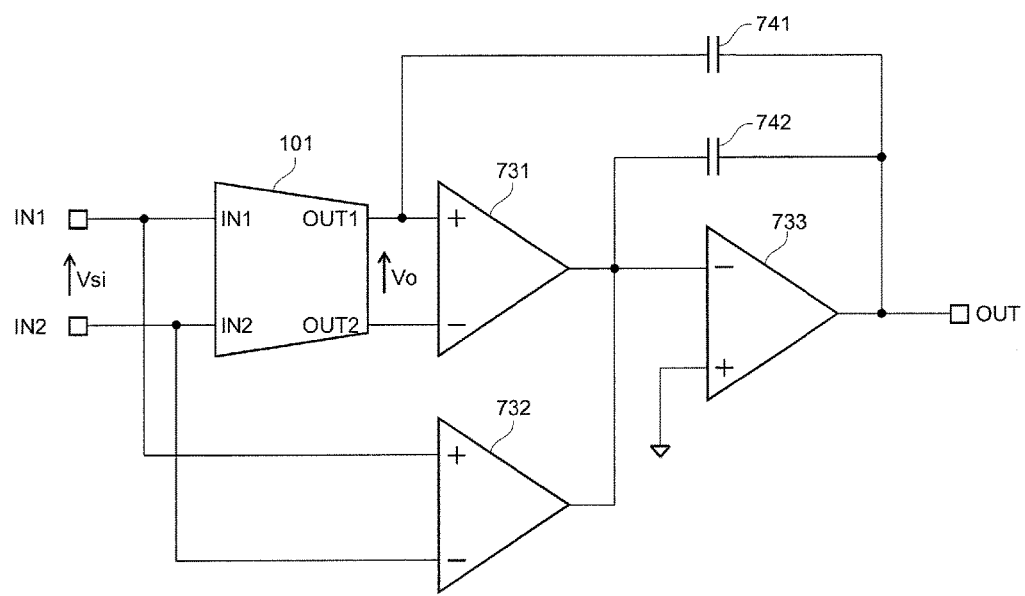
FIG. 5 is a block diagram for illustrating an example of a multipath nested miller amplifier circuit including the amplifier circuit of the embodiment.
Figure 6:
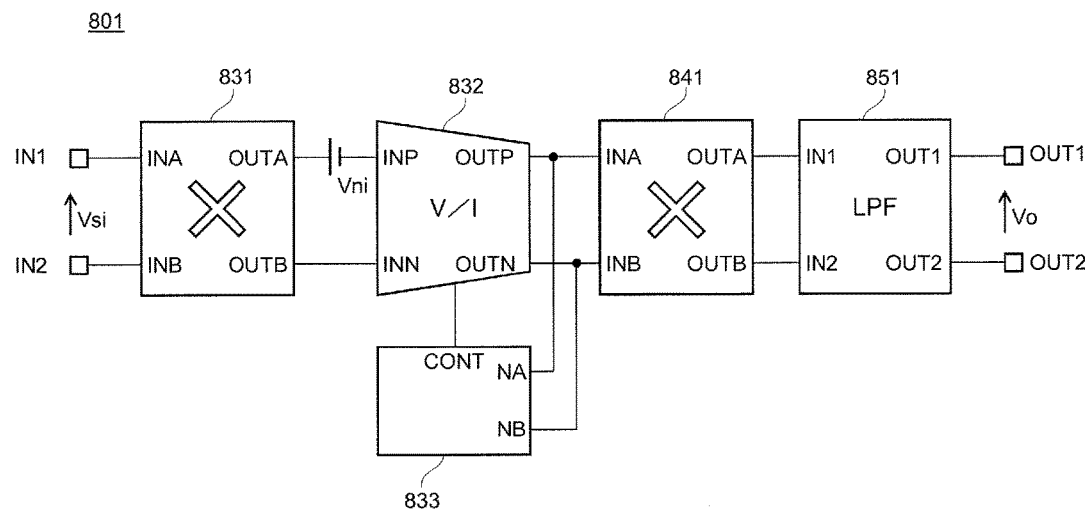
FIG. 6 is a block diagram for illustrating a related-art amplifier circuit.

FIG. 5 is a block diagram for illustrating an example of a multipath nested miller amplifier circuit including the amplifier circuit 101 of the present invention.

The multipath nested miller amplifier circuit includes the amplifier circuit 101 of the present invention, the input terminals IN1 and IN2, an output terminal OUT, capacitors 741 and 742, and amplifiers 731 to 733. The multipath nested miller amplifier circuit includes both a high-gain amplifier path formed by the amplifier circuit 101 and the amplifiers 731 and 733, and a wideband amplifier path formed by the amplifiers 732 and 733.

The amplifier circuit 101 is an amplifier circuit having reduced DC offset voltage, and is effectively applied to a high-gain amplifier path. When the amplifier circuit 101 is applied to a high-gain amplifier path, a high-gain amplifier path having reduced DC offset is achieved. With this configuration, it is possible to provide a multipath nested miller amplifier circuit capable of suppressing DC offset without an increase in chip area and degradation in frequency characteristics.

What is claimed is:

1. An amplifier circuit configured to amplify an input signal, comprising:
   a chopper switching circuit configured to provide a modulated signal of the input signal in one of a positive phase and a negative phase;

a voltage-to-current conversion circuit connected to the chopper switching circuit, and configured to generate an output current according to an output voltage from the chopper switching circuit;

a sampling circuit connected to the voltage-to-current conversion circuit including a pair of capacitors having a same capacitance value, and the sampling circuit configured to:

sample electric charges according to the output current from the voltage-to-current conversion circuit; and provide a voltage according to an electric charge obtained by one of addition and subtraction of the sampled electric charges across the pair of capacitors; and a holding circuit connected to the sampling circuit, and configured to hold the voltage output from the sampling circuit.

2. The amplifier circuit according to claim 1, wherein the sampling circuit is further configured to:

perform an operation of one of the addition and the subtraction of the sampled electric charges by parallel connection of the pair of capacitors; and provide, in synchronization with the operation, a voltage according to the electric charge subjected to one of the addition and the subtraction with the pair of capacitors connected to the holding circuit.

3. The amplifier circuit according to claim 2, wherein the pair of capacitors comprises:

a first capacitor configured to sample an electric charge according to the output current from the voltage-to-current conversion circuit when the chopper switching circuit provides the input signal in the positive phase relationship; and a second capacitor configured to sample the electric charge according to the output current from the voltage-to-current conversion circuit when the chopper switching circuit provides the input signal in the negative phase relationship.

4. A multipath nested miller amplifier circuit, comprising:

the amplifier circuit of claim 1 connected to an input terminal of the multipath nested miller amplifier circuit;

a first amplifier connected to an output terminal of the amplifier circuit;

a second amplifier connected to an input terminal of the amplifier circuit; and a third amplifier connected to an output terminal of the first amplifier and an output terminal of the second amplifier.

* * * * *